(12) United States Patent
Shih

(10) Patent No.: US 7,183,955 B1
(45) Date of Patent: Feb. 27, 2007

(54) SIGMA-DELTA MODULATOR, D/A CONVERSION SYSTEM AND DYNAMIC ELEMENT MATCHING METHOD

(75) Inventor: Ke-Yan Shih, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/152,132

(22) Filed: Jun. 14, 2005

(51) Int. Cl.
*H03M 3/00* (2006.01)

(52) U.S. Cl. ........................ 341/143; 341/144
(58) Field of Classification Search ................ 341/155, 341/144, 143
See application file for complete search history.

(56) References Cited

U.S. PATENT DOCUMENTS 6,515,607 B2 * 2/2003 Liu et al. .................... 341/143
6,677,875 B2 * 1/2004 Dagher et al. .............. 341/143
6,864,819 B2 * 3/2005 Wang ......................... 341/143
6,956,514 B1 * 10/2005 Melanson et al. .......... 341/143

* cited by examiner

*Primary Examiner*—Peguy JeanPierre
(74) *Attorney, Agent, or Firm*—Winston Hsu

(57) ABSTRACT

A sigma-delta modulator. The sigma-delta modulator comprises a summer, a loop filter, a quantizer, a D/A converter and a dynamic element matching logic. The summer receives an analog input signal and a feedback signal to generate an error signal to the loop filter which generates a filtered signal to the quantizer, thereby converting the filtered signal to a quantized output signal to the D/A converter including D/A elements and generating the feedback signal corresponding to selected D/A elements thereof. The dynamic element matching logic coupled between the quantizer and D/A converter selects the D/A elements of the D/A converter, wherein it divides the D/A elements into groups, where the number of the groups is prime to that of the D/A elements, and then selects the groups and D/A elements thereof according to the quantized output signal and the previous selection of groups and D/A elements.

20 Claims, 10 Drawing Sheets

SIGMA-DELTA MODULATOR, D/A CONVERSION SYSTEM AND DYNAMIC ELEMENT MATCHING METHOD

BACKGROUND

The invention relates to a data conversion system, and more particularly to a sigma-delta modulator, data conversion system and method with dynamic element matching logic.

Data conversion techniques have been in existence for many years, and their use has become widespread. Converters used, such as a digital-to-analog (D/A) converter or an analog-to-digital (A/D) converter, have found homes in applications such as communication systems, consumer and professional audio, and precision measurement devices.

Sigma-delta modulator (SDM), an A/D converter also known as an oversampling A/D converters characterized by high dynamic range and high resolution, has been successfully applied in communication and other signal processing areas. One-bit sigma-delta modulators have been popular in the past for their inherent linearity. However, to fulfill the demand for higher resolution and wider bandwidth without increasing the oversampling ratio, it is necessary to utilize multi-bit sigma-delta modulators which also reduce quantization noise power. Nevertheless, the major drawback of the multi-bit sigma-delta modulators is non-linearity stemming from the mismatching between the D/A elements in the feedback multi-bit D/A converter of the SDMs. FIG. 1a shows a conventional N-bit sigma-delta modulator 10 wherein N is an integer greater than 2. The N-bit sigma-delta modulator 10 comprises a summing junction 12, a loop filter 14, a N-bit quantizer 16 and a N-bit D/A converter 18. The summing junction 12 receives an analog input signal $V_{in}$ and subtracts an analog feedback signal $V_{FB}$ from the N-bit D/A converter 18. The loop filter 14 coupled to the summing junction 12, receiving the output of the summing junction 12, includes cascaded analog integrator stages and generates a filtered analog output to the N-bit quantizer 16. The N-bit quantizer 16 then quantizes the analog output of the loop filter 14 and generates a digital code, also fed back to the N-bit D/A converter 18. The N-bit D/A converter 18, having a plurality of D/A elements, converters the digital code to the analog feedback signal $V_{FB}$ to the summing junction 12. The mismatching between the D/A elements in the N-bit D/A converter 18, such as capacitors, resistors, current sources and the like, due to manufacturing variations, imperfections in materials used, changes in temperature, humidity, degradation and so on, causes non-linearity in the feedback path, which manifests itself as distortion and noise at output.

One approach addressing the non-linearity problem of the multi-bit D/A converter is dynamic element matching (DEM). FIG. 1b shows a conventional N-bit sigma-delta modulator 20 utilizing the DEM technique. FIG. 1b is similar to FIG. 1a except for the dynamic element matching logic 22 coupled between the N-bit quantizer 16 and N-bit D/A converter 18. The dynamic element matching logic 22 randomly selects the D/A elements in the N-bit D/A converter 18 to distribute the non-linear error across the spectrum. Moreover, a particular DEM technique is data weighted average (DWA). FIG. 2 illustrates the principle of the DWA technique which can be employed in the dynamic element matching logic 22 of FIG. 1b with a 3-bit D/A converter having 8 D/A elements, wherein the y-axis denotes the input digital code at every time slot and the grey blocks in x-axis and the numerals therein denote corresponding selected elements and selected order. The DWA logic regularly selects the D/A elements one by one at a predetermined turn according to the input digital code. For example, when the input digital code is 5 at t1, the DWA logic selects D/A elements, C1 to C5 in turn, and at the next time slot, t2, with input digital code, 2, the DWA logic selects D/A elements, C6, proceeding to the previous last selected element, C5, and then C7. The selection of D/A elements proceeds in the direction of the arrow. The DWA technique averages the participation of each D/A element, thus shifting DAC (D/A converter) mismatch error to a higher frequency band and providing easy implementation and first order noise shaping.

However, since the DWA logic is dependent upon the amplitude of the input digital code, in-band tones occur when the input amplitude is small, reducing both the SNDR (signal-to-noise plus distortion ratio) and SFDR (spur free dynamic range) significantly. FIG. 3a and FIG. 3b show the output frequency spectrum of a third order sigma-delta modulator having the 3-bit DAC in FIG. 1 and utilizing conventional DWA technique with the input signals of −2 dB and −45 dB respectively. By comparing FIG. 3b to FIG. 3a, it can be observed that in-band tones occur in FIG. 3b, due to the sigma-delta modulator generating periodic feedback signal with small input signal amplitude, whereas the mismatch errors between D/A elements become periodic, causing in-band aliasing tones. Thus, it is desirable to have a DWA logic, eliminating the in-band tones caused when the input signal amplitude is small.

SUMMARY

According to one aspect of the invention, a sigma-delta modulator is disclosed. The sigma-delta modulator comprises a summer, a loop filter, a quantizer, a D/A (digital-to-analog) converter, and a dynamic element matching logic. The summer receives an analog input signal and a feedback signal generating an error signal corresponding to the difference between the analog input signal and the feedback signal. The loop filter is coupled to the summer and receives the error signal therefrom to generate a filtered signal. The quantizer is coupled to the loop filter and converts the filtered signal to a quantized output signal. The D/A (digital-to-analog) converter, coupled to the summer, comprises a plurality of D/A elements generating the feedback signal corresponding to the quantized output signal to the summer with selected D/A elements thereof. The dynamic element matching logic, coupled between the quantizer and the D/A converter, receives the quantized output signal and selects the D/A elements of the D/A converter, wherein the dynamic element matching logic divides the D/A elements into a plurality of groups, where the number of the groups is prime to that of the D/A elements, and then selects the groups and D/A elements thereof according to the quantized output signal and the previous selection of groups and D/A elements.

According to another aspect of the invention, a D/A (digital-to-analog) conversion system comprises a D/A (digital-to-analog) converter and a dynamic element matching logic. The D/A (digital-to-analog) converter comprises a plurality of D/A elements generating an analog output signal corresponding to a digital input signal. The dynamic element matching logic, coupled to the D/A converter, receives the digital input signal and selects the D/A elements of the D/A converter, wherein the dynamic element matching logic divides the D/A elements into a plurality of groups, where the number of the groups is prime to that of the D/A elements, and then selects the groups and D/A elements thereof according to the digital input signal and the previous selection of groups and D/A elements.

According to another aspect of the invention, a method for selecting D/A elements according to a digital input code comprises dividing the D/A elements into a plurality of groups, wherein the number of the groups is prime to the number of the D/A elements, and selecting the groups and D/A elements according to the digital input code and the previous selection of groups and D/A elements.

DESCRIPTION OF THE DRAWINGS

The invention is described by way of exemplary embodiments, but not limitations, illustrated in the accompanying drawings in which like references denote similar elements, and in which.

DETAILED DESCRIPTION

Figure 1A:
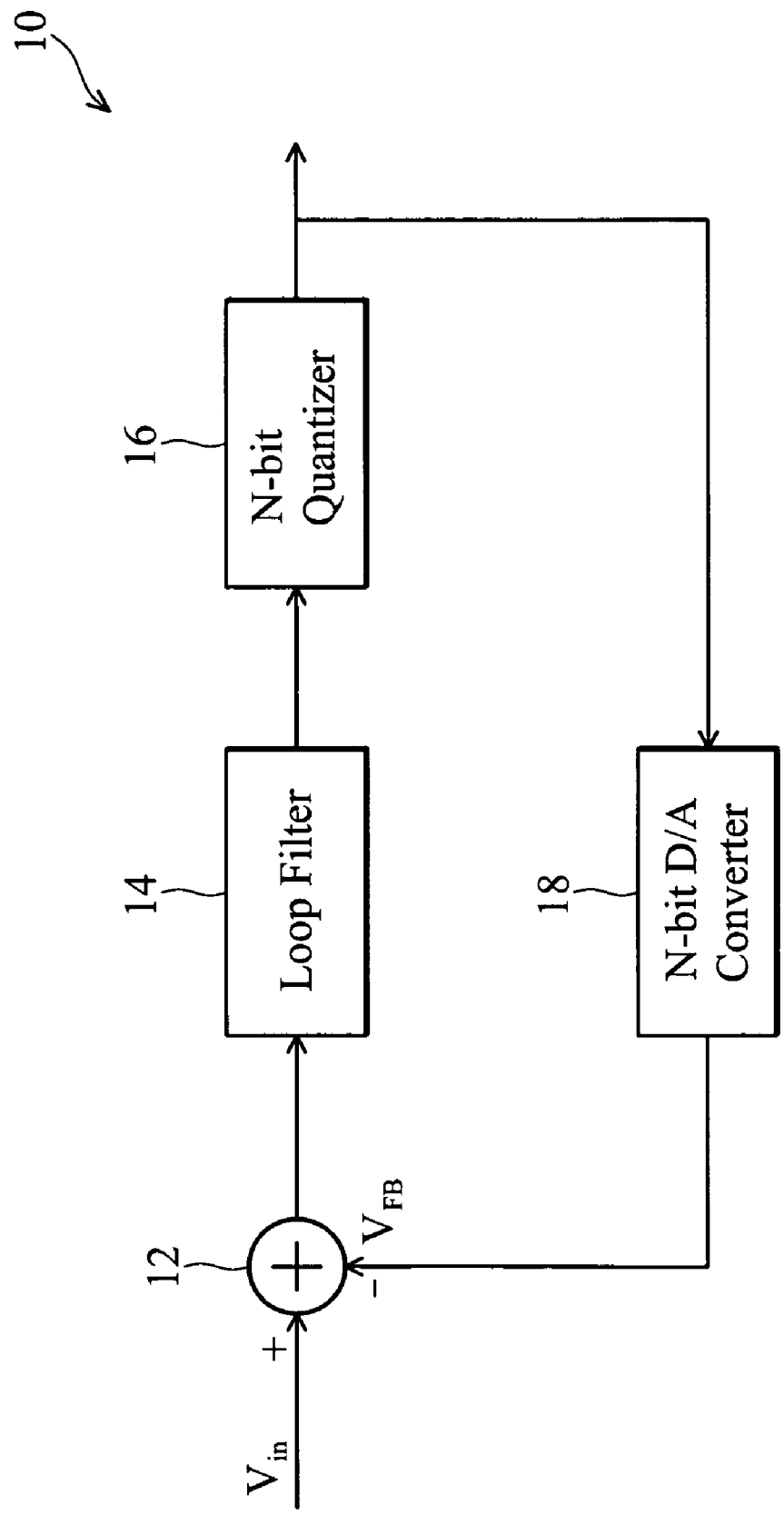
FIG. 1a is a block diagram of a conventional N-bit sigma-delta modulator.
Figure 1B:
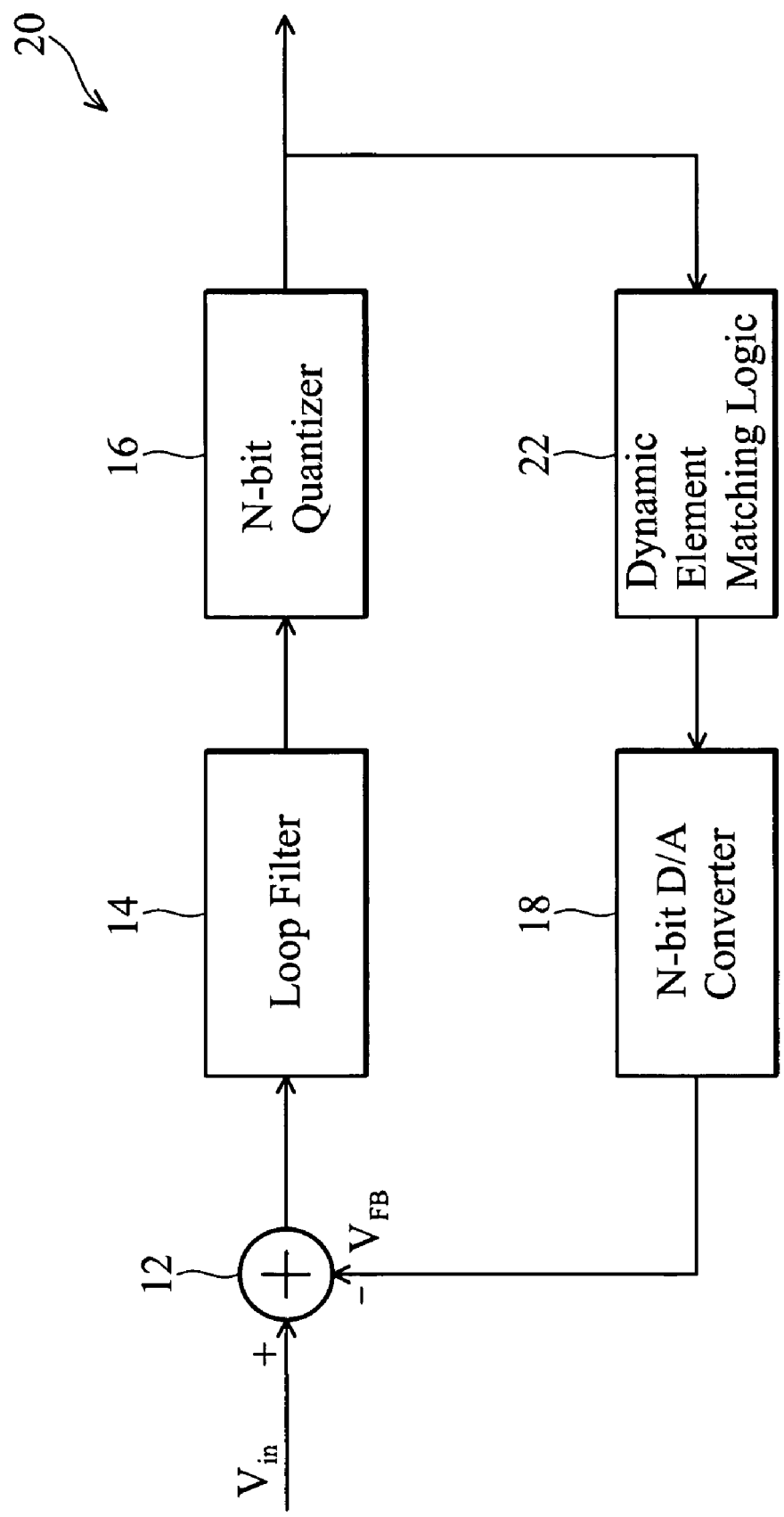
FIG. 1b is a block diagram of a conventional N-bit sigma-delta modulator utilizing DEM technique.
Figure 2:
FIG. 2 is a schematic diagram of the conventional DWA technique with a 3-bit D/A converter having 8 D/A elements.
Figure 3A:
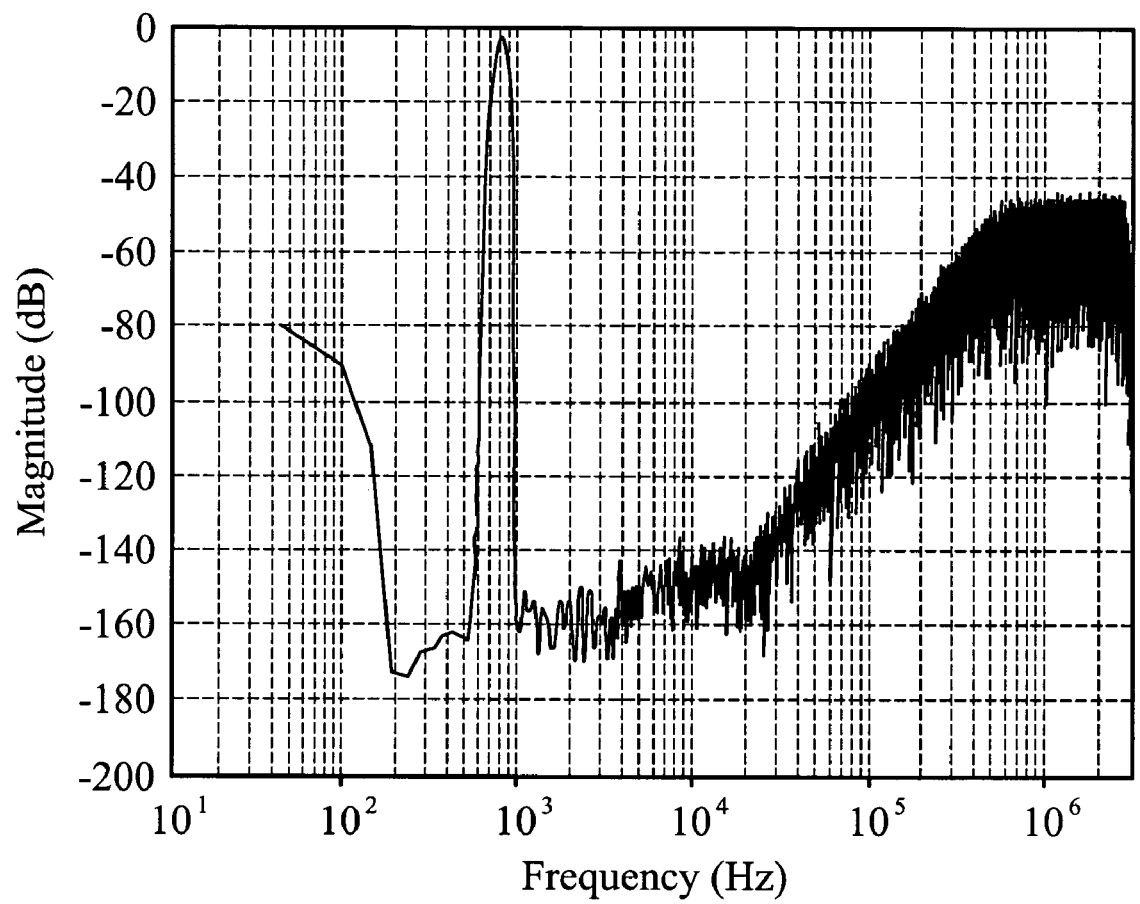
FIGS. 3a and 3b shows the output frequency spectra of a third order sigma-delta modulator with oversampling ratio, 64, having the 3-bit DAC in FIG. 2, utilizing the conventional DWA technique with input signals of −2 dB and −45 dB respectively.
Figure 3B:
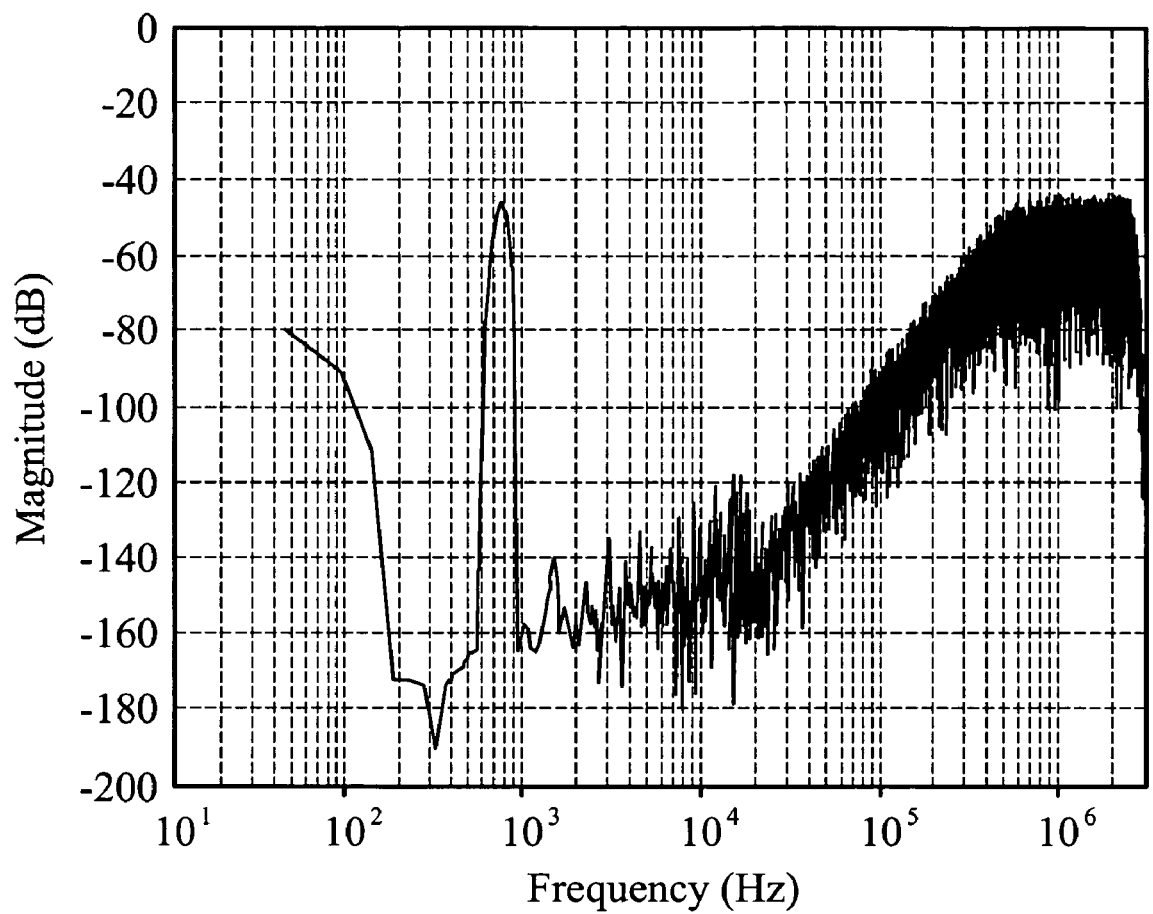
Figure 4:
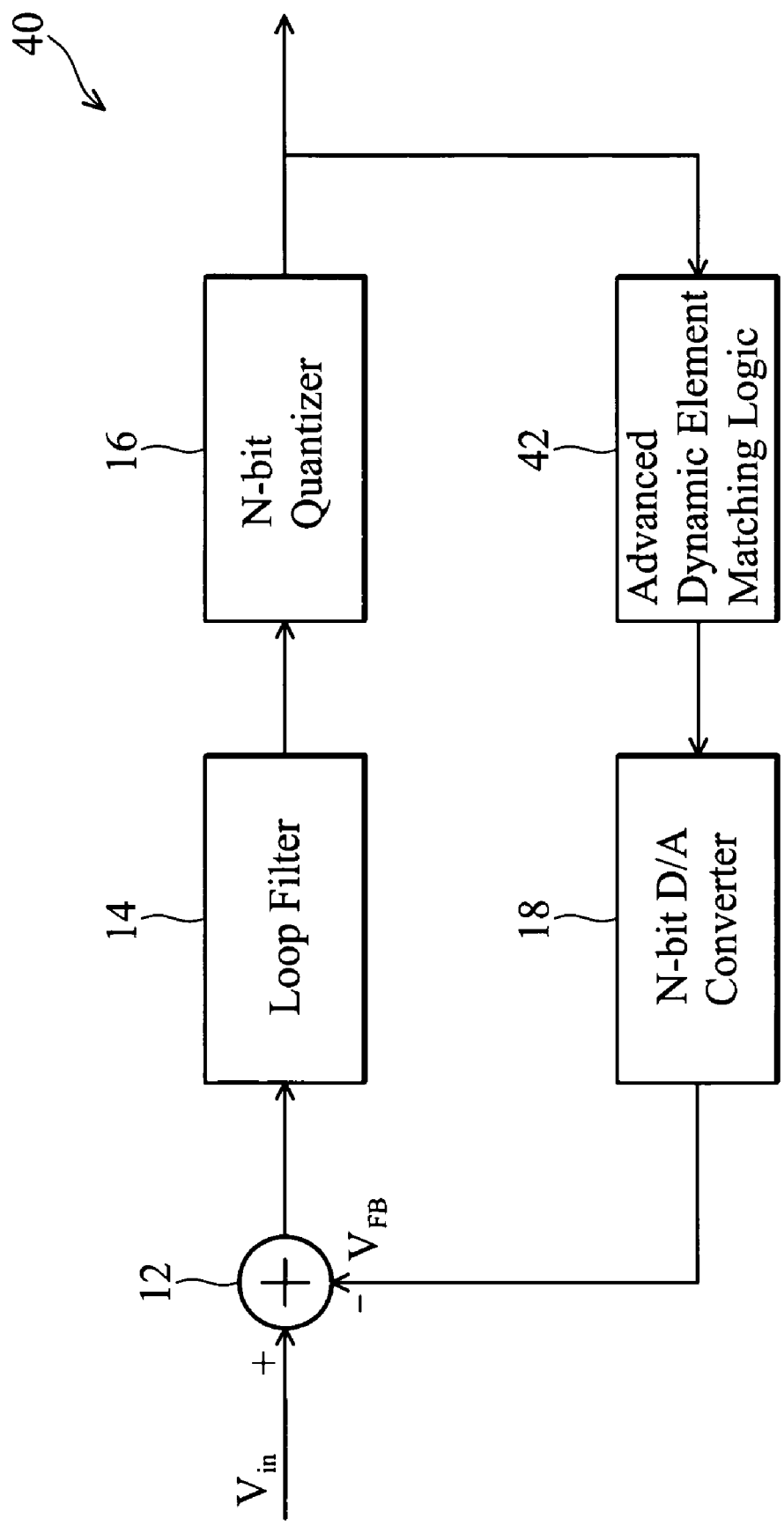
FIG. 4 is a block diagram of a N-bit sigma-delta modulator according to an embodiment of the invention.

FIG. 4 shows a multi-bit sigma-delta modulator 40 according to an embodiment of the invention. The sigma-delta modulator 40 comprises a summing junction 12, a loop filter 14, a N-bit quantizer 16, a N-bit D/A converter 18 and an advanced dynamic element matching logic 42. FIG. 4 is similar to FIGS. 1a and 1b except for the advanced dynamic element matching logic 42 coupled between the N-bit quantizer 16 and N-bit D/A converter 18. The units in FIG. 4, using the same reference numerals as those in FIG. 1a, perform the same functions, and thus are not described in further detail. The operation of the advanced dynamic element matching logic 42 is described as follows.

Figure 5:
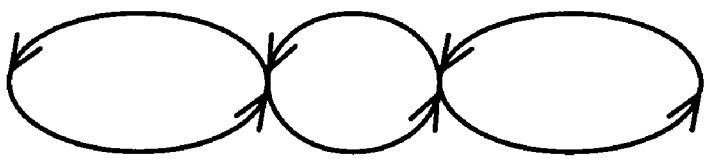
FIG. 5 is a schematic diagram of the advanced DEM of the invention with a 3-bit D/A converter having 8 D/A elements.

It is assumed that the N-bit D/A converter 18 includes 8 D/A elements, C1~C8. The advanced dynamic element matching logic 42 divides the D/A elements into groups, wherein the number of the groups is prime to the number of the D/A elements. For example, if there are 8 D/A elements in the D/A converter 18, the advanced dynamic element matching logic 42 divides C1~C8 into 3, 5, or 7 groups. FIG. 5 shows one exemplary advanced dynamic element matching logic 42 with the D/A converter 18 including 8 D/A elements according to an embodiment of the invention, wherein the advanced dynamic element matching logic 42 divides the D/A elements into 3 groups. In FIG. 5, the y-axis denotes the digital code input at every time slot and the grey blocks in x-axis and the numerals therein denote corresponding selected elements and selected orders. The advanced dynamic element matching logic 42 divides C1~C8 into 3 groups wherein C1~C3 is the first group, C4~C5 is the second, and C6~C8 is the third. When receiving digital code from the N-bit quantizer 16, the advanced dynamic element matching logic 42 selects groups and the D/A elements therein according to the digital code, and the previous selection of group and D/A element, and the number of selected dynamic elements corresponds to the digital code. For example, when the input code is 5 at time t1, the advanced dynamic element matching logic 42 selects C1 from the first group, C4 from the second group, C6 from the third group, C2 from the first group, and C5 from the second group accordingly in the turn of the arrow. When the input code is 2 at time t2, starting from the D/A element succeeding the previous last selected D/A element of the group succeeding the previous last selected group (i.e. C7 in the third group), the advanced dynamic element matching logic 42 proceeds to select C7 from the third group and C3 from the first group accordingly.

Figure 6:
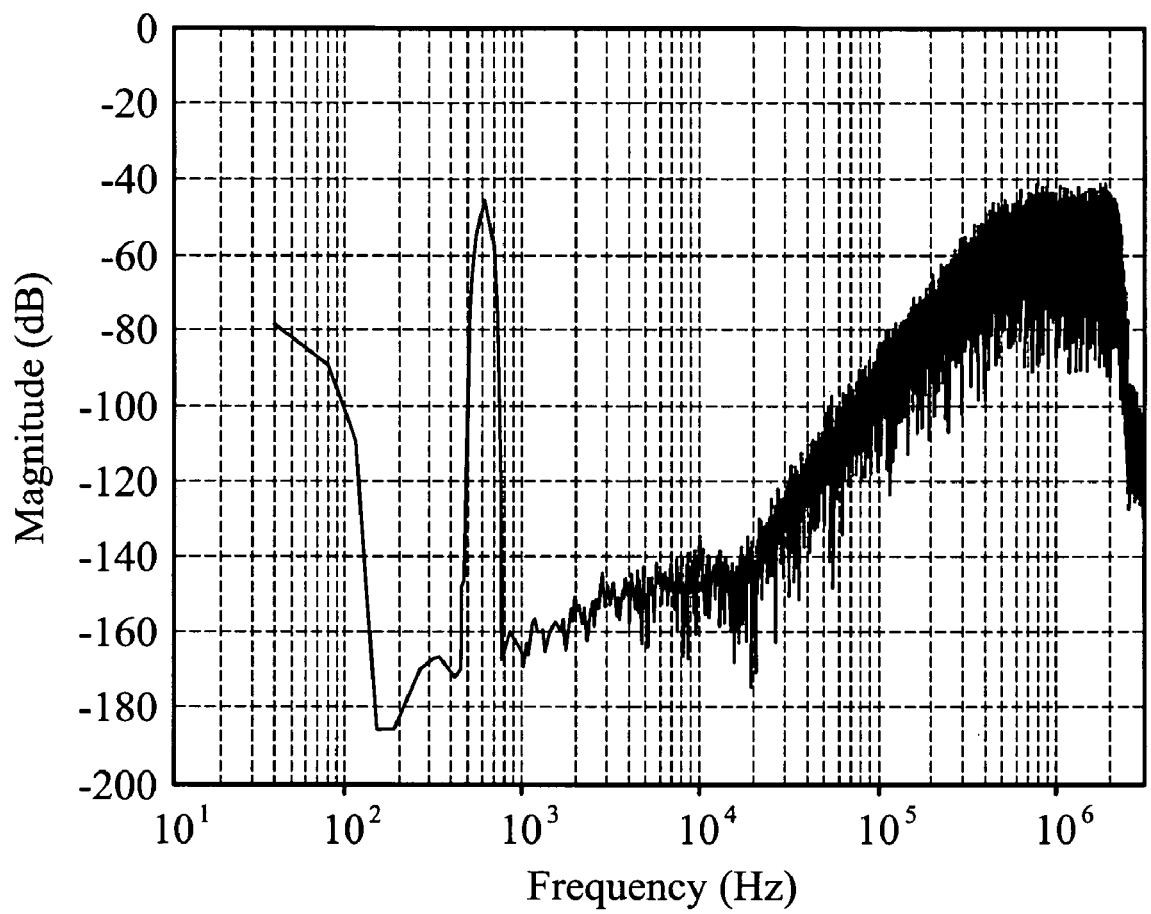
FIG. 6 shows an output frequency spectrum of the sigma-delta modulator in FIG. 4 with the input signal of −45 dB.
Figure 7:
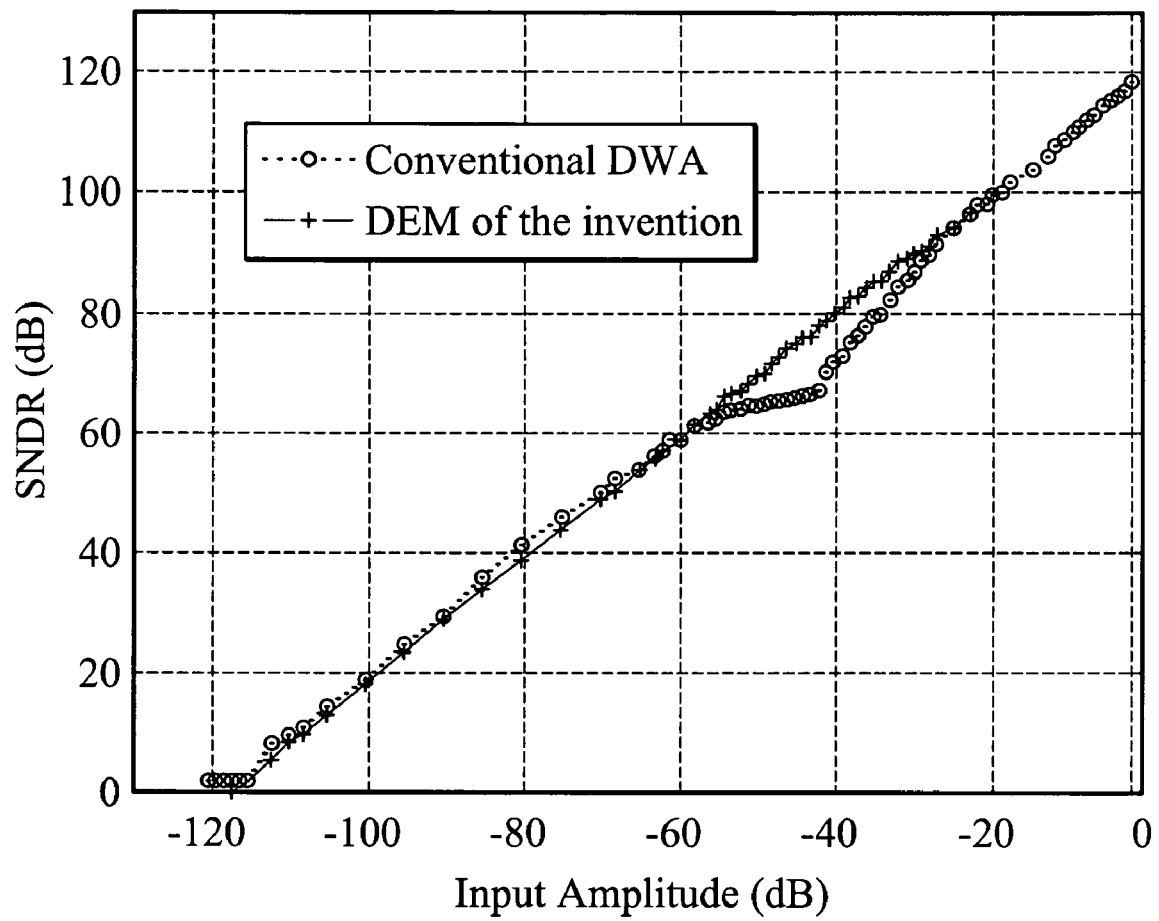
FIG. 7 is schematic diagram of input amplitude versus SNDR of sigma-delta modulators utilizing the conventional DWA technique (circle) and the advanced dynamic element matching logic of the invention (cross).

The element matching logic of the invention described effectively removes in-band tones, thus increasing the in-band efficiency of sigma-delta modulators. FIG. 6 shows the output frequency spectrum of the sigma-delta modulator in FIG. 4 according to an embodiment of the invention with input signal of −45 dB, wherein there is 0.1%~0.2% element mismatching error and advanced dynamic element matching logic 42 divides the D/A elements into 3 groups. Comparing FIG. 3b to FIG. 6, it is observed that the in-band tones are removed, and thus the efficiency of sigma-delta modulators is improved. FIG. 7 shows the input amplitude versus the SNDR of sigma-delta modulators utilizing the conventional DWA technique (circle) and the dynamic element matching logic of the invention (cross). It can be found that linearity of the sigma-delta modulator utilizing the advanced dynamic element matching logic of the invention improves on that of the sigma-delta modulator utilizing conventional DWA technique.

Figure 8:
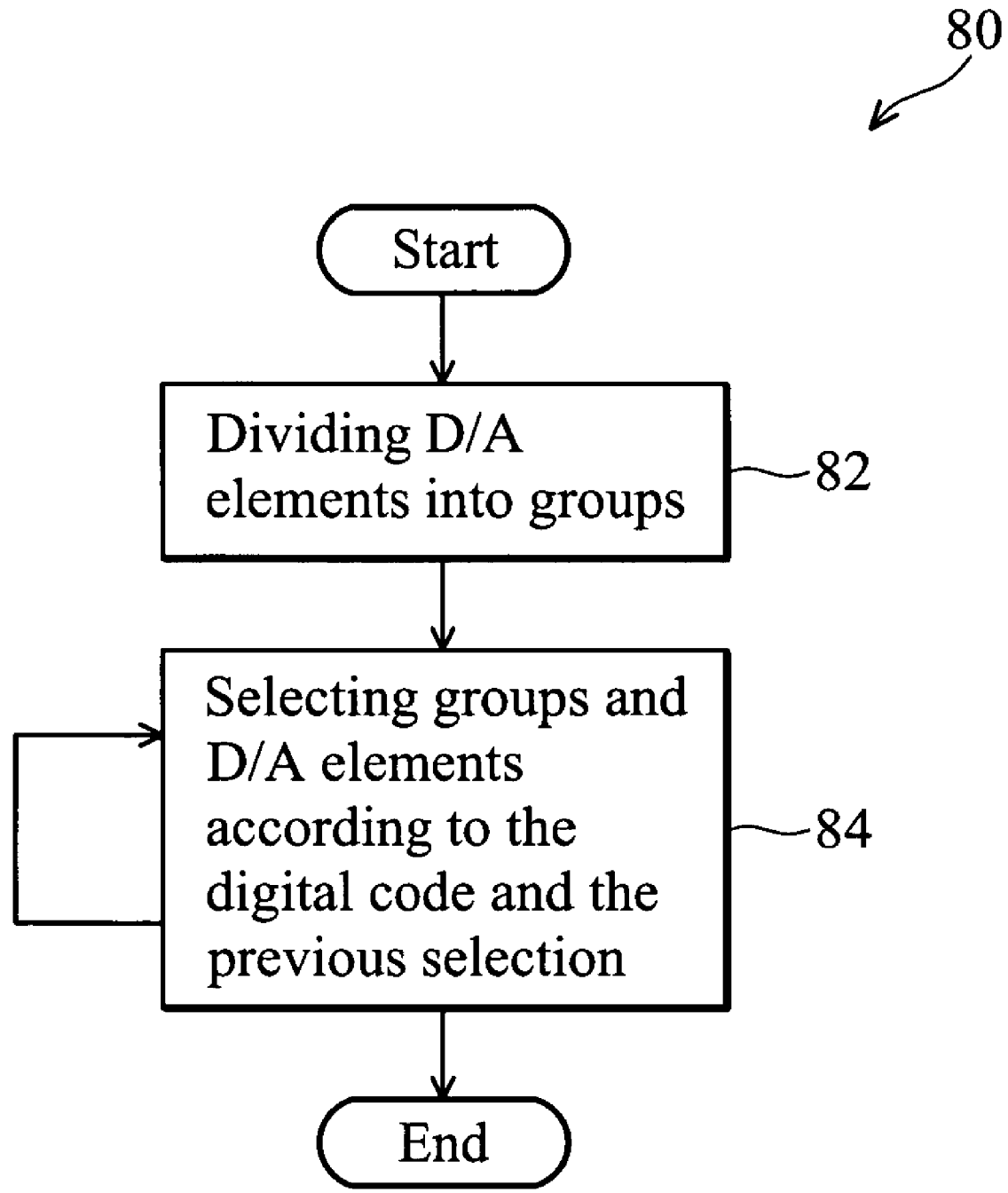
FIG. 8 is a flowchart of a method for selecting D/A elements in response to a digital code according to an embodiment of the invention.

FIG. 8 is a flowchart of a method 80 selecting D/A elements in response to a digital code according to an embodiment of the invention. The D/A elements are divided into a plurality of groups, wherein the number of the groups is prime to the number of the D/A elements (step 82). The groups and D/A elements are selected according to the digital code and the previous selection of groups and D/A elements (step 84), wherein element selection is performed at a predetermined turn. Step 84 is repeated when receiving a digital code. Moreover, in step 84, the D/A element succeeding the previous selected D/A element in the group succeeding the previous last selected group is selected first and the D/A element succeeding the previous selected D/A element in the subsequent group is selected until the number of selected dynamic elements corresponds to the digital code.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A sigma-delta modulator, comprising:
   a summer receiving an analog input signal and a feedback signal generating an error signal corresponding to a difference between the analog input signal and the feedback signal;
   a loop filter coupled to the summer, receiving the error signal to generate a filtered signal;
   a quantizer coupled to the loop filter, converting the filtered signal to a quantized output signal;
   a D/A (digital-to-analog) converter coupled to the summer, comprising a plurality of D/A elements generating the feedback signal corresponding to the quantized output signal to the summer with selected D/A elements thereof; and
   a dynamic element matching logic coupled between the quantizer and the D/A converter, receiving the quantized output signal and selecting the D/A elements of the D/A converter, wherein the dynamic element matching logic divides the D/A elements into a plurality of groups, where the number of the groups is prime to that of the D/A elements, and selects the groups and D/A elements thereof according to the quantized output signal and a previous selection of groups and D/A elements.

2. The sigma-delta modulator of claim 1, wherein the dynamic element matching logic selects the groups and D/A elements at a predetermined turn.

3. The sigma-delta modulator of claim 2, wherein the dynamic element matching logic first selects the D/A element succeeding a previous last selected D/A element in the group which succeeds the previous last selected group, and proceeds to select the D/A element succeeding the previous last selected D/A element in a subsequent group.

4. The sigma-delta modulator of claim 3, wherein the number of selected dynamic elements corresponds to the quantized output signal.

5. The sigma-delta modulator of claim 2, wherein the number of selected dynamic elements corresponds to the quantized output signal.

6. The sigma-delta modulator of claim 1, wherein the quantizer is a multi-bit quantizer.

7. The sigma-delta modulator of claim 1, wherein the D/A converter is a multi-bit D/A converter.

8. The sigma-delta modulator of claim 1, wherein the D/A elements are capacitors, resistors or current sources.

9. A D/A (digital-to-analog) conversion system comprising:
   a D/A (digital-to-analog) converter comprising a plurality of D/A elements generating an analog output signal corresponding to a digital input signal; and
   a dynamic element matching logic coupled to the D/A converter, receiving the digital input signal and selecting the D/A elements of the D/A converter, wherein the dynamic element matching logic divides the D/A elements into a plurality of groups, where the number of the groups is prime to that of the D/A elements, and selects the groups and D/A elements thereof according to the digital input signal and a previous selection of groups and D/A elements.

10. The D/A conversion system of claim 9, wherein the D/A converter generates the analog output signal with the D/A elements selected by the dynamic element matching logic.

11. The D/A conversion system of claim 9, wherein the dynamic element matching logic selects the groups and the D/A elements at a predetermined turn.

12. The D/A conversion system of claim 11, wherein the dynamic element matching logic first selects the D/A element succeeding a previous last selected D/A element in the group which succeeds the previous last selected group, and then proceeds to select the D/A element succeeding the previous last selected D/A element in a subsequent group.

13. The D/A conversion system of claim 12, wherein the number of selected dynamic elements corresponds to the digital input signal.

14. The D/A conversion system of claim 9, wherein the number of selected dynamic elements corresponds to the quantized output signal.

15. The D/A conversion system of claim 9, wherein the D/A converter is a multi-bit D/A converter.

16. The D/A conversion system of claim 9, wherein the D/A elements are capacitors, resistors or current sources.

17. A method for selecting D/A elements according to a digital input code, comprising:
   dividing the D/A elements into a plurality of groups, wherein the number of the groups is prime to the number of the D/A elements; and
   selecting the groups and D/A elements according to the digital input code and a previous selection of groups and D/A elements.

18. The method of claim 17, wherein the D/A elements are selected at a predetermined turn.

19. The method of claim 18, wherein the D/A element succeeding a previous last selected D/A element in the group which succeeds the previous last selected group is first selected, and then the D/A element succeeding the previous last selected D/A element in a subsequent group.

20. The method of claim 18, wherein the number of selected dynamic elements corresponds to the digital input code.

* * * * *